United States Patent
Tanimoto

(10) Patent No.: US 7,405,596 B2
(45) Date of Patent: Jul. 29, 2008

(54) DRIVER CIRCUIT

(75) Inventor: Takashi Tanimoto, Motosu-gun (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 58 days.

(21) Appl. No.: 11/390,371

(22) Filed: Mar. 28, 2006

(65) Prior Publication Data

US 2006/0232297 A1 Oct. 19, 2006

(30) Foreign Application Priority Data

Mar. 30, 2005 (JP) ............................ 2005-099978

(51) Int. Cl.
*H03K 19/094* (2006.01)
(52) U.S. Cl. .............................. 326/83; 326/68; 326/81; 326/86; 327/109; 327/333
(58) Field of Classification Search .................. 326/86, 326/68, 80–83, 63; 327/108–109, 333
See application file for complete search history.

(56) References Cited

U.S. PATENT DOCUMENTS

| | | | | |
|---|---|---|---|---|
| 4,797,579 A | * | 1/1989 | Lewis | 326/27 |
| 4,825,102 A | * | 4/1989 | Iwasawa et al. | 327/546 |
| 5,128,560 A | * | 7/1992 | Chern et al. | 326/81 |
| 5,426,383 A | * | 6/1995 | Kumar | 326/119 |
| 5,694,065 A | * | 12/1997 | Hamasaki et al. | 327/108 |
| 6,285,236 B1 | * | 9/2001 | Stephens | 327/391 |
| 6,472,911 B1 | * | 10/2002 | Sushihara | 327/112 |
| 6,930,528 B2 | * | 8/2005 | Ajit | 327/262 |
| 2004/0257117 A1 | * | 12/2004 | Kimura | 326/122 |
| 2005/0237085 A1 | * | 10/2005 | Ojiro | 326/87 |

FOREIGN PATENT DOCUMENTS

| KR | 10-2004-0058015 | | 7/2004 |
|---|---|---|---|
| WO | WO 03/038798 | A2 | 5/2003 |

\* cited by examiner

*Primary Examiner*—Rexford Barnie
*Assistant Examiner*—Jason M Crawford
(74) *Attorney, Agent, or Firm*—Oliff & Berridge, PLC

(57) ABSTRACT

A driver circuit is improved in drive capability corresponding to a resolution increase for a CCD sensor while suppressing chip size of a driver circuit. A preceding-stage circuit, operating on $V_{DD2}$ ($>V_{DD}$) and $V_{LOW}2$ ($<V_{LOW}$), is provided in a stage preceding an output-stage circuit operating on $V_{DD}$ and $V_{LOW}$. The output-stage has a transistor QPd that turns on when supplied with a gate voltage $V_{LOW2}$ from the preceding-stage circuit, thus outputting, onto an output terminal Vout, a voltage $V_{DD}$ and a current according to a voltage Vgs ($=V_{DD}-V_{LOW2}$). In addition, a transistor QNd turns on when supplied with a gate voltage $V_{DD2}$ from the preceding-stage circuit, thus outputting, onto an output terminal Vout, a voltage $V_{LOW}$ and a current according to a voltage Vgs ($=V_{DD2}-V_{LOW}$). Because these Vgs are greater than $V_{DD}-V_{LOW}$, the output-stage circuit can be improved in drive capability and transistor size be correspondingly suppressed.

3 Claims, 3 Drawing Sheets

DRIVER CIRCUIT

FIELD OF THE INVENTION

The present invention relates to a driver circuit integrated on a semiconductor substrate and for driving other electric circuits, and more particularly to the drive capability improvement and size reduction thereof.

BACKGROUND OF THE INVENTION

There is currently extensive development for a CCD (charge coupled device) image sensor having higher resolution but smaller size. This increases the number and decreases the width of transfer electrodes constituting a CCD shift register. For the driver circuit to drive the CCD shift register, it is necessary to increase the pulse amplitude and the drive capability. Particularly, in a frame-transfer CCD image sensor, frame-transfer operation is performed at a high rate from the imaging section to the storage section. Consequently, high drive capability is needed for the driver circuit for use in a frame-transfer CCD image sensor.

FIG. 1 is a typical circuit diagram showing a configuration of a current driver circuit. A timing circuit 2 generates various clocks at suitable timings for the operation of the CCD image sensor. Output pulses from the timing circuit 2 are input to preceding-stage circuits 4 (4a, 4b). The preceding-stage circuits 4 are each an inverter circuit formed by P-channel and N-channel MOS field-effect transistors (P-ch and N-ch MOSFETs) connected between a positive voltage source $V_{DD}$ and a negative voltage source $V_{LOW}$, to generate and output a pulse inverted in voltage magnitude relation relative to the pulse inputted to the gates of the MOSFETs from the timing circuit 2. Output pulses from the preceding-stage circuit 4 are input to an output-stage circuit 6. The output-stage circuit 6 is also an inverter circuit whose P-ch and N-ch MOSFETs are connected between $V_{DD}$ and $V_{LOW}$. This generates a pulse inverted in voltage magnitude relation relative to the input pulse from the preceding-stage circuits 4 and supplies it to the CCD image sensor.

Specifically, when each of the preceding-stage circuits 4 is supplied with an input of $V_H$ from the timing circuit 2, its N-ch MOSFET having a source connected to $V_{LOW}$ turns on so that the preceding-stage circuit 4 outputs a voltage comparable with $V_{LOW}$. Meanwhile, when each of the preceding-stage circuits 4 is supplied with an input of $V_L$ ($<V_H$) from the timing circuit 2, the P-ch MOSFET having a source connected to $V_{DD}$ turns on so that the preceding-stage circuit 4 outputs a voltage comparable with $V_{DD}$. When the voltage comparable with $V_{DD}$ is input to the output-stage circuit 6 from the preceding-stage circuit 4b, the N-ch MOSFET having a source connected to $V_{LOW}$ turns on. The N-ch MOSFET in on state sets the voltage, on the output terminal Vout connected to the CCD image sensor, to the voltage comparable with $V_{LOW}$ and supplies, to Vout, a current according to its gate-to-source voltage Vgs. Meanwhile, when the voltage comparable with $V_{LOW}$ is input to the output-stage circuit 6 from the preceding-stage circuit 4a, the P-ch MOSFET having a source connected to $V_{DD}$ turns on. The P-ch MOSFET in on state sets the voltage of Vout at a value comparable with $V_{DD}$ and supplies, to Vout, a current according to its gate-to-source voltage Vgs.

Namely, the current driver circuit has an output whose voltage amplitude ranges from $V_{LOW}$ to $V_{DD}$ while each of the MOSFETs of the output-stage circuit 6 has Vgs at ($V_{DD}$−$V_{LOW}$).

In current driver circuits, in order to raise the drive capability while maintaining the MOSFET Vgs of the output-stage circuit 6 at ($V_{DD}$−$V_{LOW}$), the transistor must be increased in size, e.g. increasing the MOSFET channel width in the output-stage circuit 6. Thus, there is encountered a problem of chip size increase in the driver circuit.

SUMMARY OF THE INVENTION

The present invention provides technology for improving the drive capability while suppressing the chip size, in a driver circuit for driving a CCD image sensor or the like.

A driver circuit according to the invention is integrated on a semiconductor substrate and for driving an external circuit, such as a CCD image sensor, connected to the circuit. The driver circuit includes a control-stage circuit connected to a voltage source having a first high voltage, and a voltage source having a first low voltage lower than the first high voltage, and outputting a control voltage based on any of the first high voltage and the first low voltage selected depending upon an input voltage, and an output-stage circuit connected to a voltage source having a second high voltage, and a voltage source having a second low voltage lower than the second high voltage, and outputting an output voltage based on any of the second high voltage and the second low voltage selected depending upon the control voltage. Here, the first high voltage and the first low voltage have a voltage difference greater than a voltage difference between the second high voltage and the second low voltage. The output-stage circuit has a first output transistor that puts a channel between the voltage source having the second high voltage and an output terminal in a conductive state when applied with the control voltage based on the first low voltage, and puts the channel in a non-conductive state when applied with the control voltage based on the first high voltage, and a second output transistor that puts a channel between the voltage source having the second low voltage and the output terminal in a conductive state when applied with the control voltage based on the first high voltage, and puts the channel in a non-conductive state when applied with the control voltage based on the first low voltage.

DESCRIPTION OF THE PREFERRED EMBODIMENT

With reference to the drawings, an embodiment of the present invention will be described.

Figure 1:
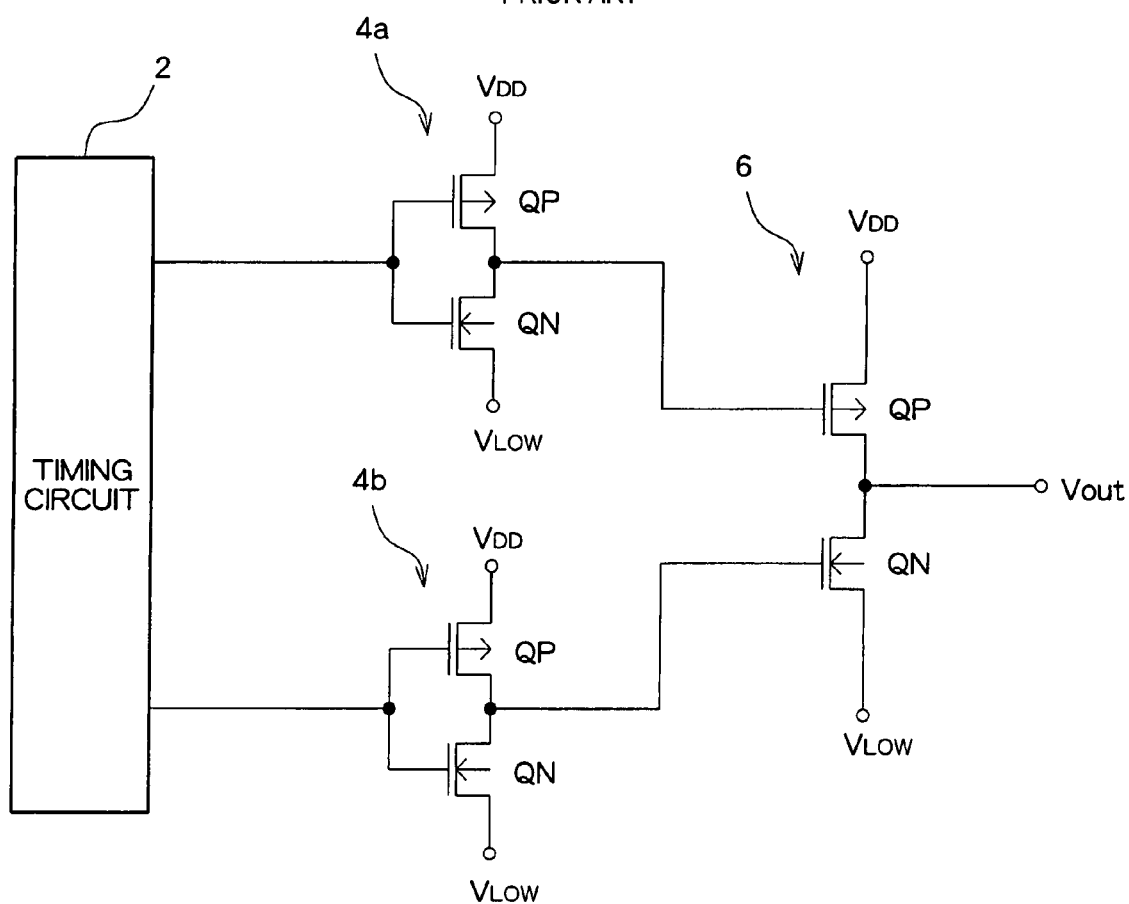
FIG. 1 is a typical circuit diagram showing a configuration of a current driver circuit.
Figure 2:
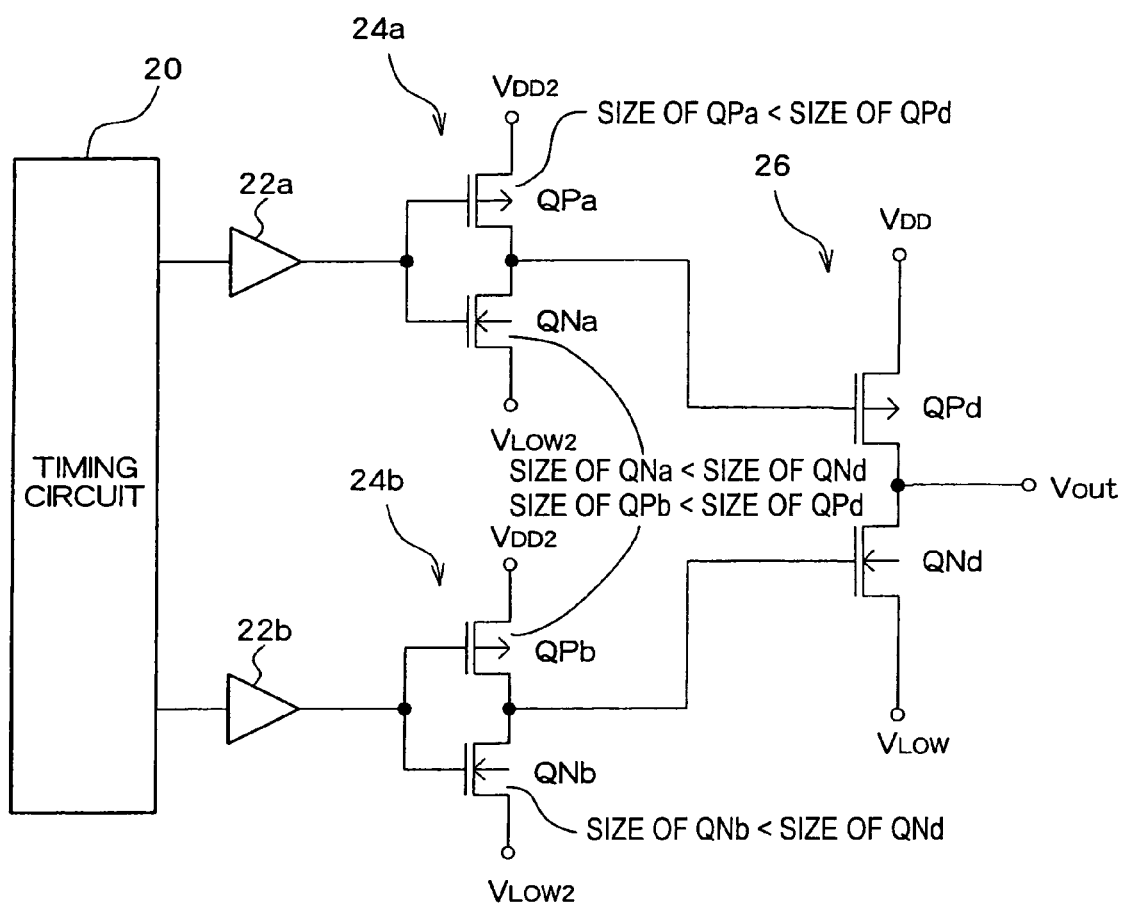
FIG. 2 is a typical circuit diagram showing a configuration of a driver circuit in an embodiment.

FIG. 2 is a typical circuit diagram showing a configuration of a driver circuit in the present embodiment. The driver circuit is for driving a CCD image sensor. A timing circuit 20 generates various clocks at suitable timings for the operation of the CCD image sensor. The timing circuit 20 outputs a predetermined low voltage $V_L$ representing a logic value of "0", or a predetermined high voltage $V_H$ representing a logic value of "1". For example, the voltages $V_L$ and $V_H$ are set at 0V and 2V, respectively.

Level shift circuits 22 (22a, 22b) convert the output voltage level $V_L$, $V_H$ of the timing circuit 20 to a level suitable for driving preceding-stage circuits 24 (24a, 24b).

Each of the preceding-stage circuits 24 are inverter circuits having P-ch and N-ch MOSFETs connected between a positive voltage source $V_{DD2}$ and a negative voltage source $V_{LOW2}$, to generate and output a pulse inverted in voltage magnitude relation relative to the input pulse from the timing circuit 20 to each of the MOSFETs gate. Here, the preceding-stage circuit 24a functions as a circuit for controlling the gate voltage of the P-ch MOSFET constituting an output-stage circuit 26, referred to later, while the preceding-stage circuit 24b functions as a circuit for controlling the gate voltage of the N-ch MOSFET constituting the output-stage circuit 26.

Specifically, the preceding-stage circuit 24a is comprised of a P-ch MOSFET QPa having a drain connected to the output terminal thereof, a source connected to the $V_{DD2}$ and a gate connected to a level-shift circuit 22a, and an N-ch MOSFET QNa having a drain connected to the output terminal thereof, a source connected to the $V_{LOW2}$ and a gate connected to the level-shift circuit 22a. The transistor QPa turns on when a voltage $V_L{'}$, which is the voltage $V_L$ shifted by the level-shift circuit 22a, is applied to the gate, and turns off when a voltage $V_H{'}$, which is the voltage $V_H$ shifted by the level-shift circuit 22a, is applied to the gate. Conversely, the transistor QNa turns on at $V_H{'}$ and off at $V_L{'}$.

Namely, the preceding-stage circuit 24a outputs a voltage comparable with $V_{DD2}$ in response to the output voltage $V_L$ of the timing circuit 20, and a voltage comparable with $V_{LOW2}$ in response to the output voltage $V_H$ of the timing circuit 20. Here, the MOSFET in on state has a drain voltage nearly equal to its source voltage. However, the voltage is not exactly equal to a source voltage $V_{DD2}$ or $V_{LOW2}$ because of a voltage drop, etc. resulting from the internal resistance etc. The "voltage comparable with $V_{DD2}$" and "voltage comparable with $V_{LOW2}$" is an expression that takes account of a difference between the drain and source voltages. From now on, this difference will be ignored for the sake of simplification, assuming that the MOSFET in on state has a drain voltage equal to the source voltage.

The preceding-stage circuit 24b is comprised of a P-ch MOSFET QPb having a drain connected to the output terminal thereof, a source connected to the $V_{DD2}$ and a gate connected to a level-shift circuit 22b, and an N-ch MOSFET QNb having a drain connected to the output terminal thereof, a source connected to the $V_{LOW2}$ and a gate connected to the level-shift circuit 22b. Thus, the preceding-stage circuit 24b operates similarly to the preceding-stage circuit 24a, to output $V_{DD2}$ in response to the output voltage $V_L$ of the timing circuit 20, and $V_{LOW2}$ in response to the output voltage $V_H$ of the timing circuit 20.

The output-stage circuit 26 is an inverter circuit having P-ch and N-ch MOSFETs connected between $V_{DD}$ and $V_{LOW}$. In response to the input pulse from the preceding-stage circuit 24, the output-stage circuit 26 generates a pulse inverted in voltage magnitude relation and supplies this voltage to the CCD image sensor.

Specifically, the output-stage circuit 26 is comprised of a P-ch MOSFET QPd having a drain connected to the output terminal $V_{OUT}$, a source connected to the $V_{DD}$ and a gate connected to the preceding-stage circuit 24a, and an N-ch MOSFET QNd having a drain connected to the output terminal $V_{OUT}$, a source connected to $V_{LOW}$ and a gate connected to the preceding-stage circuit 24b. The transistor QPd turns on when $V_{LOW2}$ from the preceding-stage circuit 24a is applied to the gate, and turned off when $V_{DD2}$ is applied to the gate. Conversely, the transistor QNd turns on at $V_{DD2}$ and off at $V_{LOW2}$.

Namely, the output-stage circuit 26 outputs a voltage comparable with $V_{LOW}$ in response to the output voltage $V_L$ from the timing circuit 20, and a voltage comparable with $V_{DD}$ in response to the output voltage $V_H$ from the timing circuit 20.

The transistor QPd, when turned on, has a gate-to-source voltage Vgs of $(V_{DD}-V_{LOW2})$ while the transistor QNd, when turned on, has a voltage Vgs of $(V_{DD2}-V_{LOW})$. Here, $V_{DD2}$ is set higher than $V_{DD}$ while $V_{LOW2}$ is set lower than $V_{LOW}$. Accordingly, the voltage Vgs when the transistors OPd and QNd are in the on state is greater than $(V_{DD}-V_{LOW})$, which is the MOSFET Vgs on the current circuit having a preceding-stage circuit 4 operating on $V_{DD}$ and $V_{LOW}$. For example, comparing the present circuit with the current circuit assuming that the MOSFETs in the output-stage circuit are equal in size, the output-stage MOSFETs in the present circuit have a source-to-drain current greater than those of the current circuit. Thus, a greater current is supplied from Vout to the CCD image sensor.

Figure 3:
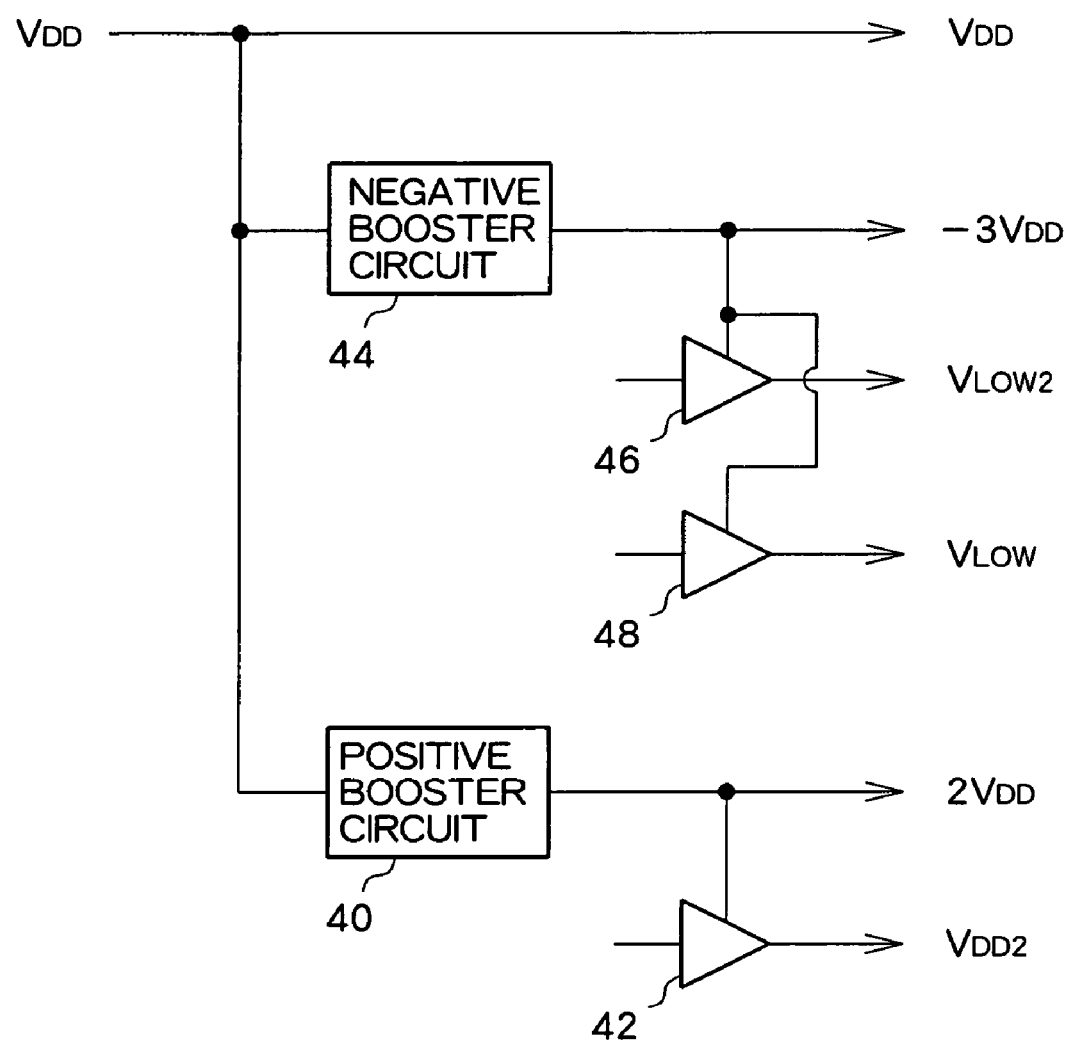
FIG. 3 is a typical circuit diagram showing a power supply circuit for the driver circuit in the embodiment.

FIG. 3 is a typical configuration diagram of a power supply circuit for the present driver circuit. The power supply circuit generates $V_{DD2}$, $V_{LOW}$ and $V_{LOW2}$ from $V_{DD}$ supplied, for example, from a battery, and supplies these voltages to the preceding-stage circuit 24 and output-stage circuit 26. A positive booster circuit 40 amplifies the positive input voltage $V_{DD}$. The positive booster circuit 40 piles up positive voltage pulses by means, for example, of a charge pump, thereby obtaining a desired positive voltage. For example, the positive booster circuit 40 produces a voltage that is double the $V_{DD}$ and outputs this voltage. A regulator 42 generates $V_{DD2}$ using the output of the positive booster circuit 40. A negative booster circuit 44 amplifies the positive input voltage $V_{DD}$ in the reverse direction. The negative booster circuit 44 piles up negative voltage pulses by means, for example, of a charge pump, thereby obtaining a desired negative voltage. For example, the negative booster circuit 44 produces and outputs a voltage that is negative and three times the magnitude of $V_{DD}$. A regulator 46 generates $V_{LOW2}$ using the output of the negative booster circuit 44. In addition, a regulator 48 generates $V_{LOW}$ using the output of the negative booster circuit 44. For example, in the case of $V_{DD}=+2.9$ V, the positive booster circuit 40 outputs +5.8 while the negative booster circuit 44 outputs −8.7 V. Meanwhile, the regulator 42 generates +5.0 which is slightly lower than the output of the positive booster circuit 40 and supplies it as $V_{DD2}$. The regulator 46 generates −8.0V that is slightly higher than the output of the negative booster circuit 40 and supplies it as $V_{LOW2}$. The regulator 48 generates −6.0 which is higher than the voltage of the negative booster circuit 46, and supplies this voltage as $V_{LOW}$.

In the configuration described above, the transistors QPd, QNd were both improved in drive capability and reduced in size by increasing the on-state Vgs thereof. The voltage Vgs may be increased for any one of the transistors. For example, for source-to-drain currents equal in magnitude, the transistor QPd, operating with holes as a carrier, is possibly greater in size than the transistor QNd. For this reason, by configuring the preceding-stage circuit 24 to operate on $V_{DD}$ and $V_{LOW2}$, the transistor QPd in on state can have a voltage Vgs of $(V_{DD}-V_{LOW2})$ while the transistor QNd in on state can have a voltage Vgs of $(V_{DD}-V_{LOW})$. This circuit configuration enables size reduction especially for the transistor QPd that tends to be greater in size compared to QNd.

Incidentally, the preceding-stage circuit 24 serves as a buffer for handling drive-capability difference between the timing circuit 20 and the output-stage circuit 26. Namely, the output-stage circuit 26 requiring a greater drive capability has MOSFETs with a greater gate capacity. If it is directly driven by the output of the timing circuit 20 having a smaller drive capability, there is a problem that sufficient frequency characteristic can not be obtained. For this reason, the preceding-stage circuit 24 is made up of MOSFETs smaller in size than those of the output-stage circuit 26 and amplifies the output current of the timing circuit 20. The amplified current is supplied to the MOSFETs of the output-stage circuit 26 to drive them. In this respect, the preceding-stage circuit 24 may be provided in a plurality of stages, to raise the drive capability stage by stage while increasing the MOSFET size.

As described above, a driver circuit according to the invention is integrated on a semiconductor substrate for driving an external circuit, such as a CCD image sensor, connected to the circuit. The driver circuit includes a control-stage circuit connected to a voltage source having a first high voltage and a voltage source having a first low voltage lower than the first high voltage, and outputting a control voltage based on any of the first high voltage or the first low voltage selected depending upon an input voltage, and an output-stage circuit connected to a voltage source having a second high voltage and a voltage source having a second low voltage lower than the second high voltage, and outputting an output voltage based on any of the second high voltage or the second low voltage selected depending upon the control voltage. The first high voltage and the first low voltage have a voltage difference greater than a voltage difference between the second high voltage and the second low voltage. The output-stage circuit has a first output transistor that puts a channel between the voltage source having the second high voltage and an output terminal in a conductive state when applied with the control voltage based on the first low voltage, and puts the channel in a non-conductive state when applied with the control voltage based on the first high voltage, and a second output transistor that puts a channel between the voltage source having the second low voltage and the output terminal in a conductive state when applied with the control voltage based on the first high voltage, and puts the channel in a non-conductive state when applied with the control voltage based on the first low voltage.

According to the invention, where the first and second output transistors of the output-stage circuit are configured by MOS transistors, the gate-to-source voltage Vgs when conductive can be made greater than the difference between the second high voltage and the second low voltage. This can increase the drive capability while keeping the transistor size the same. On the other hand, for an equal drive capability, the invention can reduce the transistor size in the output-stage circuit and hence suppress the chip size.

In the driver circuit, the first high voltage can be set equal to or higher than the second high voltage and the first low voltage can be set equal to or lower than the second low voltage.

The control-stage circuit can be configured by a first control transistor that puts a channel between the voltage source having the first high voltage and a control terminal for outputting the control voltage in a conductive state when the input voltage is a predetermined low input voltage, and puts the channel in a non-conductive state when the input voltage is a predetermined high input voltage, and a second control transistor that puts a channel between the voltage source having the first low voltage and the control terminal in a conductive state when the input voltage is the high input voltage, and puts the channel in a non-conductive state when the input voltage is the low input voltage.

Meanwhile, the first control transistor can be configured smaller in size than the first output transistor, the second control transistor being smaller in size than the second output transistor.

The voltage source for the first high voltage can be configured having a positive booster circuit that positively increases the second high voltage, by predetermined multiples, and a regulator that generates the first high voltage based on an output voltage of the positive booster circuit. Meanwhile, the voltage sources for the first and second low voltages can be configured having a negative booster circuit that negatively increases the second high voltage, by predetermined multiples, a regulator that generates the first low voltage based on an output voltage of the negative booster circuit, and a regulator that generates the second low voltage based on an output voltage of the negative booster circuit.

What is claimed is:

1. A driver circuit integrated on a semiconductor substrate and driving an external circuit connected to the circuit, the driver circuit comprising:

a control-stage circuit connected to a voltage source having a first high voltage and a voltage source having a first low voltage lower than the first high voltage, and outputting a control voltage based on any of the first high voltage or the first low voltage selected depending upon an input voltage; and an output-stage circuit connected to a voltage source having a second high voltage and a voltage source having a second low voltage lower than the second high voltage, and outputting an output voltage based on any of the second high voltage or the second low voltage selected depending upon the control voltage;

the output-stage circuit having a first output transistor that puts a first channel between the voltage source having the second high voltage and an output terminal in a conductive state when applied with the control voltage based on the first low voltage, and puts the first channel in a non-conductive state when applied with the control voltage based on the first high voltage, and a second output transistor that puts a second channel between the voltage source having the second low voltage and the output terminal in a conductive state when applied with the control voltage based on the first high voltage, and puts the second channel in a non-conductive state when applied with the control voltage based on the first low voltage, wherein the first high voltage is higher than the second high voltage and the first low voltage is lower than the second low voltage, and the voltage source having the first high voltage has a positive booster circuit that positively increases the second high voltage by predetermined multiples, and a regulator that generates the first high voltage based on an output voltage of the positive booster circuit; the voltage sources having the first and second low voltages including a negative booster circuit that negatively increases the second high voltage by predetermined multiples, a regulator that generates the first low voltage based on an output voltage of the negative booster circuit, and a regulator that generates the second low voltage based on an output voltage of the negative booster circuit.

2. The driver circuit according to claim 1, wherein the control-stage circuit has a first control transistor that puts a third channel between the voltage source having the first high voltage and a control terminal for outputting the control voltage in a conductive state when the input voltage is a predetermined low input voltage, and puts the third channel in a non-conductive state when the input voltage is a predetermined high input voltage, and a second control transistor that places a fourth channel between the voltage source having the first low voltage and the control terminal in a conductive state when the input voltage is the high input voltage, and puts the fourth channel in a non-conductive state when the input voltage is the low input voltage.

3. The driver circuit according to claim 2, wherein the first control transistor is smaller in size than the first output transistor, and the second control transistor is smaller in size than the second output transistor.

* * * * *